(12) United States Patent
Terrill et al.

(10) Patent No.: US 9,425,305 B2
(45) Date of Patent: Aug. 23, 2016

(54) STRUCTURES OF AND METHODS OF FABRICATING SPLIT GATE MIS DEVICES

(75) Inventors: Kyle Terrill, Santa Clara, CA (US); Yang Gao, San Jose, CA (US); Chanho Park, Pleasanton, CA (US)

(73) Assignee: Vishay-Siliconix, Santa Clara, CA (US)

(*) Notice: Subject to any disclaimer, the term of this patent is extended or adjusted under 35 U.S.C. 154(b) by 653 days.

(21) Appl. No.: 12/869,554

(22) Filed: Aug. 26, 2010

(65) Prior Publication Data

US 2011/0210406 A1 Sep. 1, 2011

Related U.S. Application Data

(60) Provisional application No. 61/253,455, filed on Oct. 20, 2009.

(51) Int. Cl.
| | |
|---|---|
| H01L 29/78 | (2006.01) |
| H01L 29/40 | (2006.01) |
| H01L 29/66 | (2006.01) |
| H01L 29/423 | (2006.01) |

(52) U.S. Cl.
CPC .......... *H01L 29/7811* (2013.01); *H01L 29/407* (2013.01); *H01L 29/66734* (2013.01); *H01L 29/7813* (2013.01); *H01L 29/4238* (2013.01); *H01L 29/42368* (2013.01)

(58) Field of Classification Search
CPC .............. H01L 29/407; H01L 29/0847; H01L 29/42368
USPC .................... 257/330, 340, 341, 386, E29.118
See application file for complete search history.

(56) References Cited

U.S. PATENT DOCUMENTS

| | | |
|---|---|---|
| 4,710,790 A | 12/1987 | Okamoto et al. |
| 4,881,105 A | 11/1989 | Davari et al. |
| 5,283,201 A | 2/1994 | Tsang et al. |
| 5,321,289 A | 6/1994 | Baba et al. |
| 5,477,071 A | 12/1995 | Hamamoto et al. |
| 5,502,320 A | 3/1996 | Yamada |
| 5,614,751 A | 3/1997 | Yilmaz et al. |
| 5,637,898 A | 6/1997 | Baliga |
| 5,668,026 A | 9/1997 | Lin et al. |
| 5,726,463 A | 3/1998 | Brown et al. |
| 5,763,915 A | 6/1998 | Hshieh et al. |
| 5,864,159 A | 1/1999 | Takahashi |

(Continued)

FOREIGN PATENT DOCUMENTS

| | | |
|---|---|---|
| DE | 102005041322 | 3/2007 |
| EP | 0717450 A | 6/1996 |

(Continued)

OTHER PUBLICATIONS

K Imai et al., "Decrease in Trenched Surface Oxide Leakage Currents by Rounding Off Oxidation", Extended Abstracts of the 18.sup.th (1986 International) Conference on Solid State Devices and Materials, Tokyo 1986, pp. 303-306.

(Continued)

*Primary Examiner* — Thomas L Dickey

(57) ABSTRACT

A split gate field effect transistor device. The device includes a split gate structure having a trench, a gate electrode and a source electrode. A first poly layer is disposed within the trench and is connected to the gate electrode. A second poly layer connected to the source electrode, wherein the first poly layer and the second poly layer are independent.

12 Claims, 4 Drawing Sheets

(56) References Cited

U.S. PATENT DOCUMENTS

| | | |
|---|---|---|
| 5,877,528 A | 3/1999 | So |
| 5,914,503 A | 6/1999 | Iwamuro et al. |
| 5,998,833 A | 12/1999 | Baliga |
| 6,031,265 A | 2/2000 | Hshieh |
| 6,084,264 A | 7/2000 | Darwish |
| 6,211,549 B1 | 4/2001 | Funaki et al. |
| 6,242,775 B1 | 6/2001 | Noble |
| 6,255,683 B1 | 7/2001 | Radens et al. |
| 6,281,547 B1 | 8/2001 | So et al. |
| 6,291,298 B1 | 9/2001 | Williams et al. |
| 6,309,929 B1 | 10/2001 | Hsu et al. |
| 6,404,007 B1 | 6/2002 | Mo et al. |
| 6,413,822 B2 | 7/2002 | Williams et al. |
| 6,462,376 B1 | 10/2002 | Wahl et al. |
| 6,489,204 B1 | 12/2002 | Tsui |
| 6,495,884 B2 | 12/2002 | Harada et al. |
| 6,525,373 B1 | 2/2003 | Kim |
| 6,545,315 B2 | 4/2003 | Hshieh et al. |
| 6,548,860 B1 | 4/2003 | Hshieh et al. |
| 6,621,107 B2 | 9/2003 | Blanchard et al. |
| 6,683,346 B2 | 1/2004 | Zeng |
| 6,707,128 B2 | 3/2004 | Moriguchi et al. |
| 6,781,199 B2 | 8/2004 | Takahashi |
| 6,838,722 B2 | 1/2005 | Bhalla et al. |
| 6,882,000 B2 | 4/2005 | Darwish et al. |
| 6,900,100 B2 | 5/2005 | Williams et al. |
| 6,906,380 B1 | 6/2005 | Pattanayak et al. |
| 6,921,697 B2 | 7/2005 | Darwish et al. |
| 7,005,347 B1 | 2/2006 | Bhalla et al. |
| 7,009,247 B2 | 3/2006 | Darwish |
| 7,335,946 B1 | 2/2008 | Bhalla et al. |
| 7,345,342 B2 | 3/2008 | Challa et al. |
| 7,385,248 B2 | 6/2008 | Herrick et al. |
| 7,393,749 B2 | 7/2008 | Yilmaz et al. |
| 7,494,876 B1 | 2/2009 | Giles et al. |
| 7,544,571 B2 | 6/2009 | Park |
| 7,598,143 B2 | 10/2009 | Zundel et al. |
| 7,868,381 B1 | 1/2011 | Bhalla et al. |
| 7,936,009 B2 | 5/2011 | Pan et al. |
| 8,247,865 B2 | 8/2012 | Hirler |
| 8,629,505 B2 | 1/2014 | Nishiwaki |
| 8,686,493 B2 | 4/2014 | Thorup et al. |
| 2002/0036319 A1 | 3/2002 | Baliga |
| 2002/0056884 A1 | 5/2002 | Baliga |
| 2003/0086296 A1 | 5/2003 | Wu et al. |
| 2003/0178676 A1* | 9/2003 | Henninger et al. ........... 257/340 |
| 2003/0201502 A1 | 10/2003 | Hsieh |
| 2004/0021173 A1 | 2/2004 | Sapp |
| 2004/0038479 A1 | 2/2004 | Hshieh |
| 2004/0084721 A1 | 5/2004 | Kocon et al. |
| 2004/0113202 A1 | 6/2004 | Kocon et al. |
| 2005/0001268 A1* | 1/2005 | Baliga ........................... 257/341 |
| 2005/0079676 A1 | 4/2005 | Mo et al. |
| 2005/0082591 A1 | 4/2005 | Hirler et al. |
| 2005/0151190 A1 | 7/2005 | Kotek et al. |
| 2005/0167742 A1 | 8/2005 | Challa et al. |
| 2006/0017056 A1 | 1/2006 | Hirler |
| 2006/0113577 A1 | 6/2006 | Ohtani |
| 2006/0209887 A1 | 9/2006 | Bhalla et al. |
| 2006/0214221 A1 | 9/2006 | Challa et al. |
| 2006/0273386 A1 | 12/2006 | Yilmaz et al. |
| 2006/0281249 A1 | 12/2006 | Yilmaz et al. |
| 2007/0004116 A1 | 1/2007 | Hshieh |
| 2007/0037327 A1 | 2/2007 | Herrick et al. |
| 2007/0108511 A1 | 5/2007 | Hirler |
| 2007/0108515 A1 | 5/2007 | Hueting et al. |
| 2007/0132014 A1 | 6/2007 | Hueting |
| 2007/0155104 A1 | 7/2007 | Marchant et al. |
| 2007/0221952 A1 | 9/2007 | Thorup et al. |
| 2008/0073707 A1 | 3/2008 | Darwish |
| 2008/0076222 A1 | 3/2008 | Zundel et al. |
| 2008/0135889 A1 | 6/2008 | Session |
| 2008/0166845 A1 | 7/2008 | Darwish |
| 2008/0197407 A1 | 8/2008 | Challa et al. |
| 2008/0199997 A1 | 8/2008 | Grebs et al. |
| 2008/0265289 A1 | 10/2008 | Bhalla et al. |
| 2009/0035900 A1 | 2/2009 | Thorup et al. |
| 2009/0050959 A1 | 2/2009 | Madson |
| 2009/0057756 A1 | 3/2009 | Hshieh |
| 2009/0072301 A1 | 3/2009 | Bhalla et al. |
| 2009/0162989 A1 | 6/2009 | Cho et al. |
| 2009/0246923 A1 | 10/2009 | Park |
| 2009/0273026 A1 | 11/2009 | Wilson et al. |
| 2009/0309156 A1 | 12/2009 | Darwish et al. |
| 2010/0006928 A1 | 1/2010 | Pan et al. |
| 2011/0079843 A1 | 4/2011 | Darwish et al. |
| 2011/0089485 A1 | 4/2011 | Gao et al. |
| 2012/0043602 A1 | 2/2012 | Zeng et al. |
| 2012/0061753 A1 | 3/2012 | Nishiwaki |
| 2012/0267704 A1 | 10/2012 | Siemieniec et al. |
| 2013/0049072 A1 | 2/2013 | Heineck et al. |
| 2013/0221436 A1 | 8/2013 | Hossain et al. |

FOREIGN PATENT DOCUMENTS

| | | |
|---|---|---|
| JP | S63296282 | 2/1988 |
| JP | H03211885 | 1/1990 |
| JP | 03211885 | 9/1991 |
| JP | H07-045817 | 2/1995 |
| JP | H07-235676 | 9/1995 |
| JP | H08-167711 | 6/1996 |
| JP | H10173175 | 6/1998 |
| JP | H11068102 | 9/1999 |
| JP | 2000223705 | 8/2000 |
| JP | 2001308327 | 11/2001 |
| JP | 2002110984 | 4/2002 |
| JP | 2003282870 | 10/2003 |
| JP | 2003309263 | 10/2003 |
| JP | 2004241413 | 8/2004 |
| JP | 2005032941 | 2/2005 |
| JP | 2005057050 | 3/2005 |
| JP | 2005191221 | 7/2005 |
| JP | 2006202931 | 8/2006 |
| JP | 2007529115 | 10/2007 |
| JP | 2008543046 | 11/2008 |
| JP | 2008546189 | 12/2008 |
| JP | 2008546216 | 12/2008 |
| JP | 2009505403 | 2/2009 |
| JP | 2009141005 | 6/2009 |
| JP | 2009542202 | 11/2009 |
| JP | 2010505270 | 2/2010 |
| JP | 2011258834 | 12/2011 |
| JP | 2012059943 | 3/2012 |
| JP | 2013508980 | 3/2013 |
| WO | 9403922 | 2/1994 |
| WO | 0025363 | 5/2000 |
| WO | 0025365 | 5/2000 |
| WO | 0042665 | 7/2000 |
| WO | 0051167 A | 8/2000 |
| WO | 0065646 A | 11/2000 |
| WO | 2005065385 | 7/2005 |
| WO | 2006127914 | 11/2006 |
| WO | 2007021701 | 2/2007 |
| WO | 2007129261 | 11/2007 |
| WO | 2009026174 | 2/2009 |
| WO | 2011050115 | 4/2011 |

OTHER PUBLICATIONS

Y. Baba et al., "High Reliable UMOSFET with Oxide-Nitride Complex Gate Structure" 1997 IEEE, pp. 369-372.

Hsu et al., "A Novel Trench Termination Design for 100-V TMBS Diode Application", IEEE Electron Device Letters, vol. 22 No. 11, Nov. 2001, pp. 551-552.

Initial Publication with ISR, Nov. 7, 2013, International application No. PCT/US2013/038956, Korean Intellectual Property Office, Republic of Korea.

Initial Publication with ISR, Nov. 7, 2013, International application No. PCT/US2013/038957, Korean Intellectual Property Office, Republic of Korea.

* cited by examiner

STRUCTURES OF AND METHODS OF FABRICATING SPLIT GATE MIS DEVICES

This application claims the benefit of U.S. Provisional Patent Application No. 61/253,455, filed Oct. 20, 2009, "STRUCTURES OF AND METHODS OF FABRICATING SPLIT GATE MIS DEVICES", by Terrill, et al., which is incorporated herein in its entirety.

FIELD OF THE INVENTION

The present invention relates to trench MOS transistors.

BACKGROUND OF THE INVENTION

Power MOSFETs (metal-oxide-semiconductor field-effect transistors) comprise one of the most useful field effect transistors implemented in both analog and digital circuit applications as energy saving switches.

In general, a trench-based power MOSFET is built using a vertical structure as opposed to a planar structure. The vertical structure enables the transistor to sustain both high blocking voltage and high current.

The conventional trench MOS transistors have realized much higher cell density than the planar MOS transistors. But the denser pitches and the trench structures have increased gate-drain overlap capacitances and gate-drain charges. At high density the resistance of these structures is mainly limited by the epitaxial resistance for a given breakdown voltage. The so called split gate structure was proposed to overcome several drawbacks of the conventional trench structure performance. In this structure a shielded poly, which is connected to the source, is placed under the gate poly inside the trench.

Split gate structures have been known to have better switching, breakdown voltage, and lower on-resistance characteristics. But due to its complexity the split gate structure is more difficult to manufacture. Also at high density it is necessary to bury the split gate structure under a top isolation oxide so that a space saving self-aligned contact technique can be utilized. Under these conditions difficulties in forming a isolation oxide, gate poly, inter poly oxide and shield poly inside a trench are very challenging.

SUMMARY OF THE INVENTION

Embodiments of the present invention implement high density power field effect transistor that avoids the channel mobility problems caused by gate oxide scattering, that exhibits lower forward voltage (Vf) rated at high current; and that shows shorter channel length for faster switching. This invention can apply to DC-DC conversion as a synchronized rectifier transistor.

In one embodiment, the present invention is implemented as a split gate field effect transistor device. The device includes a split gate structure having a trench, a gate electrode and a source electrode, a first poly layer a disposed within the trench and connected to the source electrode. A second poly layer is disposed within the trench and connected to the gate electrode, wherein the first poly layer and the second poly layer are independent.

In one embodiment, the device further includes a gate contact connecting the second poly layer to the gate electrode, and a source contact connecting the first poly layer to the source electrode. Both contacts are made within the trench region.

In one embodiment, the device further includes an active region body and a source contact, wherein the active region body and the source contact are disposed at a same surface plane.

In one embodiment, the same surface plane is established via a CMP compatible process.

In one embodiment, a layout method is used to enable a CMP compatible process to connect the first poly layer to the source electrode and the second poly layer to the gate electrode the same surface plane with active region source contacts.

In one embodiment, the present invention is implemented as a CMP compatible split gate field effect transistor device. The device includes a split gate structure having a trench, a gate electrode and a source electrode. The device further includes a first poly layer disposed within the trench and connected to the source electrode, a second poly layer disposed within the trench and connected to the gate electrode, wherein the first poly layer and the second poly layer are independent. The device further includes a metal layer disposed over the split gate structure.

In one embodiment, the device further includes a gate contact connecting the second poly layer to the gate electrode, and a source contact connecting the first poly layer to the source electrode. Both contacts are made within the trench region.

In one embodiment, the device further includes an active region body and a source contact, wherein the active region body and the source contact are disposed at a same surface plane.

In one embodiment, the same surface plane is established via a CMP compatible process.

In one embodiment, a layout method is used to enable a CMP compatible process to connect the first poly layer to the source electrode and the second poly layer to the gate electrode the same surface plane with active region source contacts.

In one embodiment, the present invention is implemented as a planar split gate field effect transistor device, comprising:

The device includes a split gate structure having a trench, a gate electrode and a source electrode. The device further includes a first poly layer disposed within the trench and connected to the source electrode, a second poly layer disposed within the trench and connected to the gate electrode, wherein the first poly layer and the second poly layer are independent. The device further includes a metal layer disposed over the split gate structure, and wherein the first poly layer and the second poly layer are coplanar.

In one embodiment, the device further includes a gate contact connecting the second poly layer to the gate electrode, and a source contact connecting the first poly layer to the source electrode. Both contacts are made within the trench region.

In one embodiment, the device further includes an active region body and a source contact, wherein the active region body and the source contact are disposed at a same surface plane.

In one embodiment, the same surface plane is established via a CMP compatible process.

In one embodiment, a layout method is used to enable a CMP compatible process to connect the first poly layer to the source electrode and the second poly layer to the gate electrode in the same surface plane with active region source contacts.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE EMBODIMENTS

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Embodiments of the present invention function with trench MOS transistors having much higher cell density than conventional planar MOS transistors. Embodiments of the present invention utilize a split gate structure that overcome certain drawbacks of the conventional trench structure performance. Embodiments of the present invention employ a split gate structure having a shielded poly, which is connected to the source, is placed under the gate poly inside the trench. This feature provides better switching, breakdown voltage, and lower on-resistance characteristics.

Embodiments of the present invention advantageously utilize chemical mechanical polishing (CMP) to facilitate the fabrication of the complex split gate structure. The split gate structure is buried under a top isolation oxide so that a space saving self-aligned contact technique can be utilized. The use of chemical mechanical polishing facilitates the forming a isolation oxide, gate poly and shield poly inside a trench.

Figure 1:
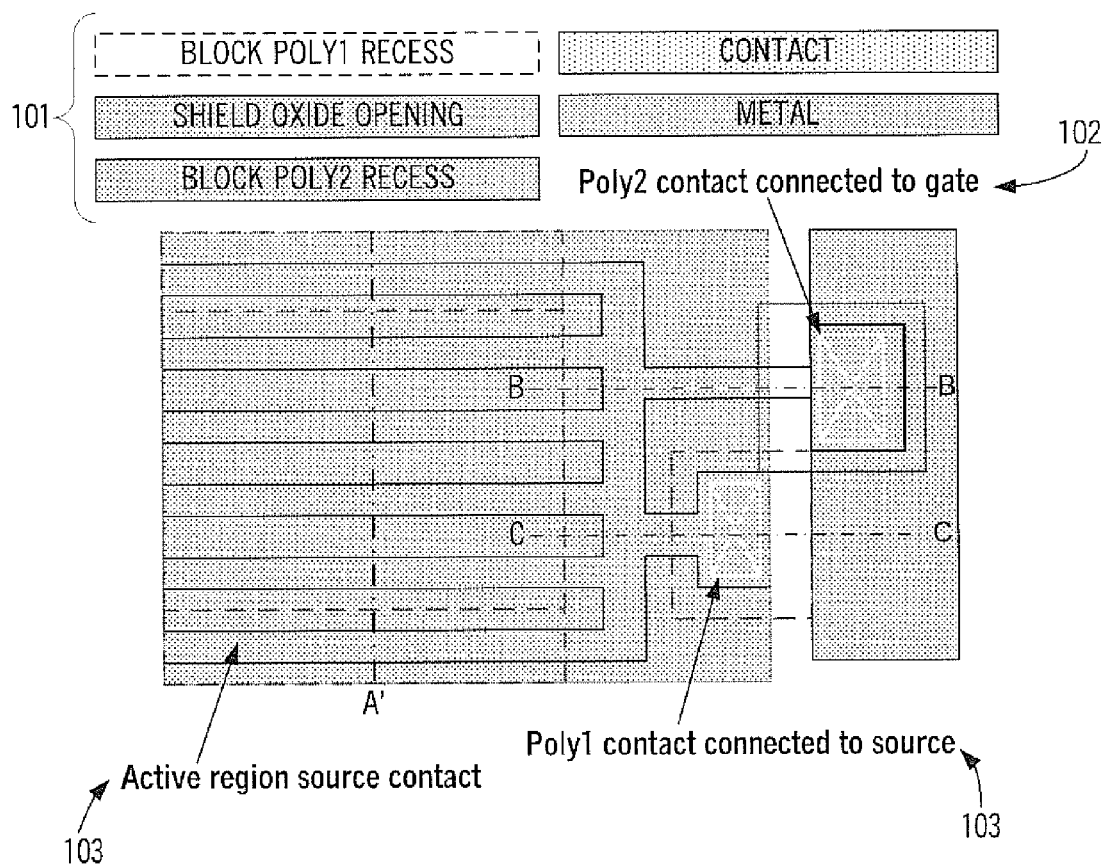
FIG. 1 shows a top-down view of a split gate structure in accordance with one embodiment of the present invention.

FIG. 1 shows a top-down view 100 of a split gate structure in accordance with one embodiment of the present invention. As depicted in FIG. 1, the view 100 shows an active region source contact 104 and a poly1 contact 103 connected the source electrode and a poly2 contact 102 connected to the gate electrode at the same surface plane. A legend 101 indicates the nature of the shaded areas of the view 100.

FIG. 1 embodiment comprises a chip design with oxide CMP and poly CMP compatible process and layout specifically tailored to fabricate a split gate power MOSFET. In the FIG. 1 embodiment, both the gate poly and source poly are picked up inside the trench. In one embodiment, device cell contact is realized by a self-aligned contact method. This process is highly scalable due to its inherit CMP compatibility.

As described above, embodiments of the present invention utilize chemical mechanical polishing to facilitate fabrication of the split gate structure. The use of CMP allows for the planarization of each film inside the trench. This aspect results in better structure control and improved process margin. In order for CMP to be used, both the process and device layout need to be optimized to generate a planner structure. An extra benefit of such a planner structure is the improvement in photo lithography depth of focus. The above described features of embodiments of the present invention enable an improved ability to scale the features of the process to a smaller dimension.

Figure 2A:
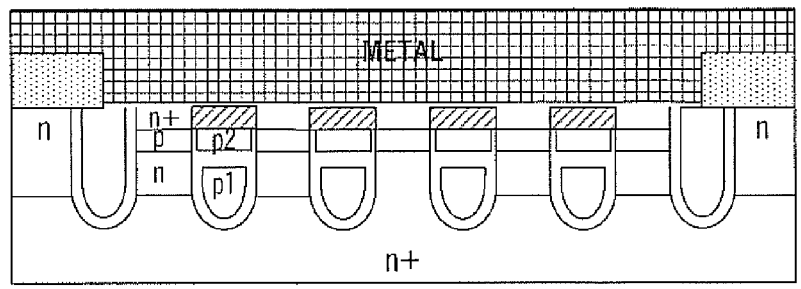
FIG. 2A shows a first cross sectional view of cut line A-A' from FIG. 1 in accordance with one embodiment of the present invention.
Figure 2B:
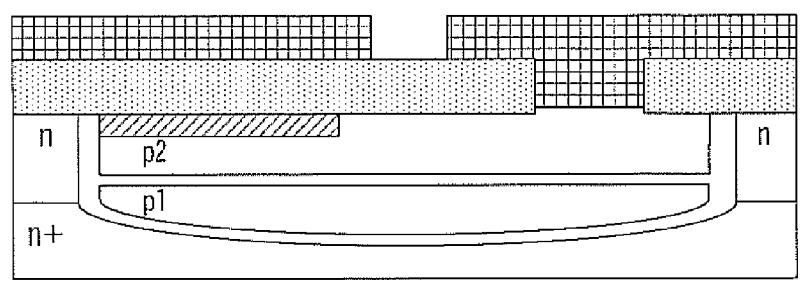
FIG. 2B shows a second cross sectional view of cut line B-B' from FIG. 1 in accordance with one embodiment of the present invention.
Figure 2C:
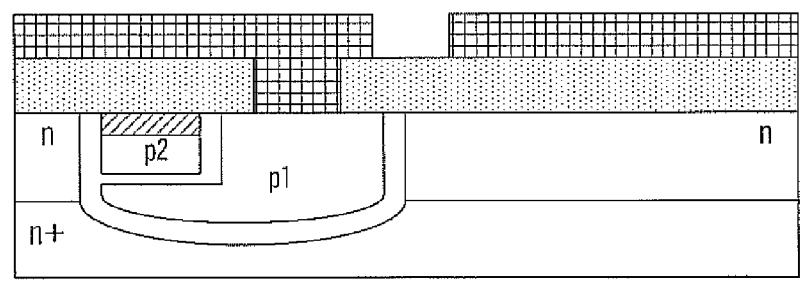
FIG. 2C shows a third cross sectional view of cut line C-C' from FIG. 1 in accordance with one embodiment of the present invention.

FIGS. 2A-C shows delineates the cross sectional views of the cut-lines of A-A', B-B', and C-C' of FIG. 1. Specifically, FIG. 2A shows the cross sectional view 201 of cut line A-A'.
FIG. 2B shows the cross sectional view 202 of cut line B-B'.
FIG. 2C shows the cross sectional view 203 of cut line C-C'.

As depicted in the FIGS. 2A-C, the views 201-203 show the structures of the fabricated trench gated MIS device shown in FIG. 1. As described above, the fabricated trench gated MIS device incorporates split gate structures that have two independent poly layers inside the trench connected to the gate electrode and the source electrode, respectively.

In accordance with embodiments of the present invention, the fabricated trench gated MIS device implements the split gate structures having gate contact connecting the second poly layer and source contact connecting the first poly layer, and active region body and source contact at the same surface plane through CMP compatible processes.

It should be noted that in addition to the illustrated FIG. 1 method, there exist a number of different layout methods to connect poly1 layer to the source electrode effectively at the same surface plane with the other gate poly2 contacts and the active region source contacts that are within the scope of embodiments of the present invention.

Figure 3A:
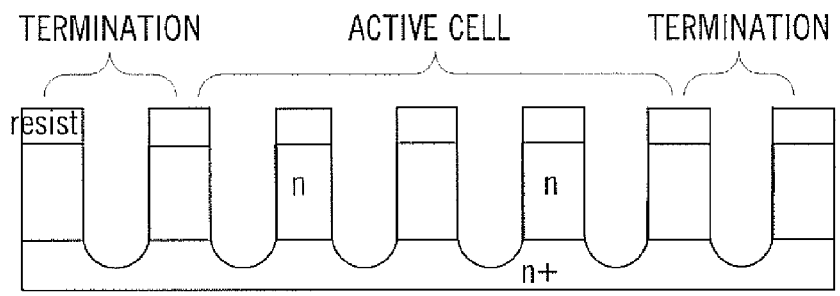
FIG. 3A shows a first exemplary sequential process step implementing split gate structures using surface planarization by CMP in accordance with a one embodiment of the present invention.
Figure 3B:
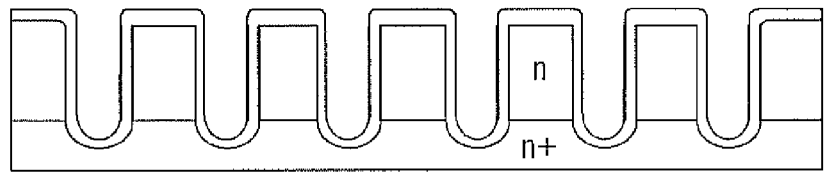
FIG. 3B shows a second exemplary sequential process step implementing split gate structures using surface planarization by CMP in accordance with a one embodiment of the present invention.
Figure 3C:
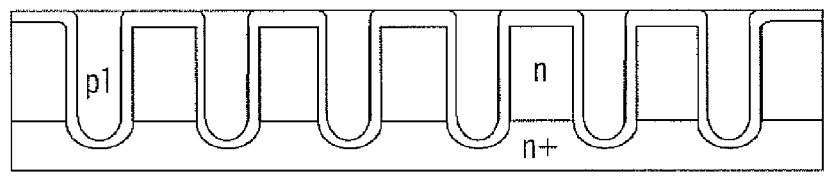
FIG. 3C shows a third exemplary sequential process step implementing split gate structures using surface planarization by CMP in accordance with a one embodiment of the present invention. This figure shows the process profile after first poly CMP.
Figure 3D:
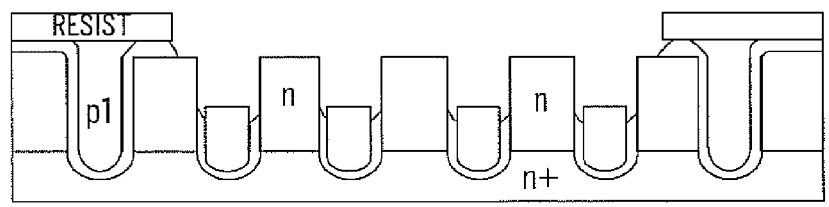
FIG. 3D shows a fourth exemplary sequential process step implementing split gate structures using surface planarization by CMP in accordance with a one embodiment of the present invention.
Figure 3E:
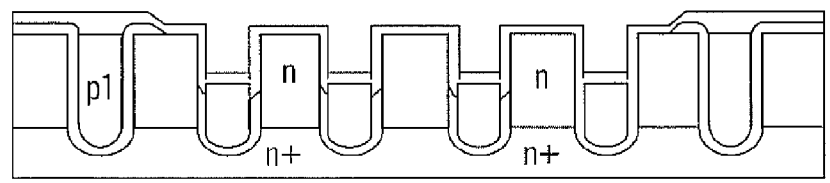
FIG. 3E shows a fifth exemplary sequential process step implementing split gate structures using surface planarization by CMP in accordance with a one embodiment of the present invention.

FIGS. 3A-3E shows exemplary sequential process steps implementing split gate structures using surface planarization by CMP. Specifically, FIG. 3C shows the vertical structures after the application of poly1 and planarization via CMP.

Figure 4A:
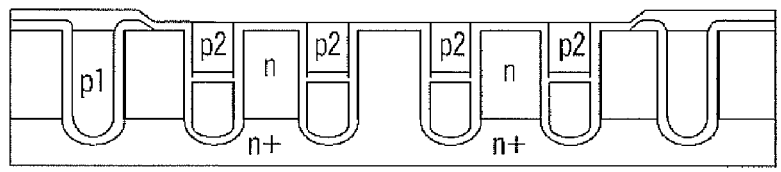
FIG. 4A shows a sixth exemplary sequential process step implementing split gate structures using surface planarization by CMP in accordance with a one embodiment of the present invention. This figure shows the process profile after second poly CMP.
Figure 4B:
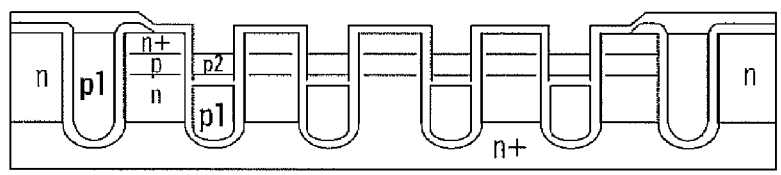
FIG. 4B shows a seventh exemplary sequential process step implementing split gate structures using surface planarization by CMP in accordance with a one embodiment of the present invention.
Figure 4C:
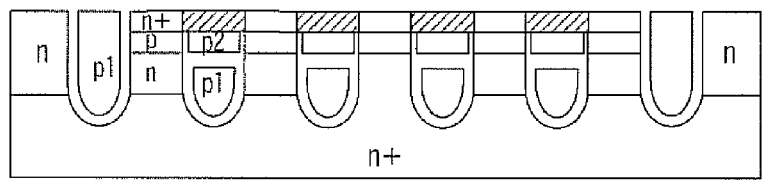
FIG. 4C shows an eighth exemplary sequential process step implementing split gate structures using surface planarization by CMP in accordance with a one embodiment of the present invention. This figure shows the process profile after isolation oxide CMP.
Figure 4D:
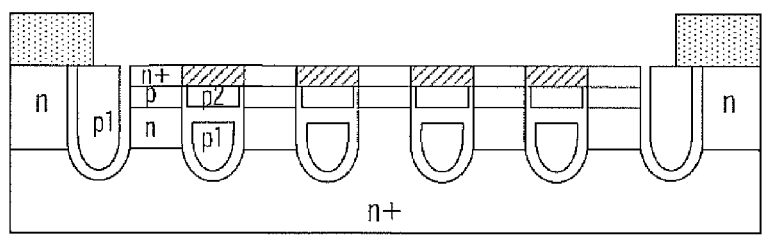
FIG. 4D shows a ninth exemplary sequential process step implementing split gate structures using surface planarization by CMP in accordance with a one embodiment of the present invention.
Figure 4E:
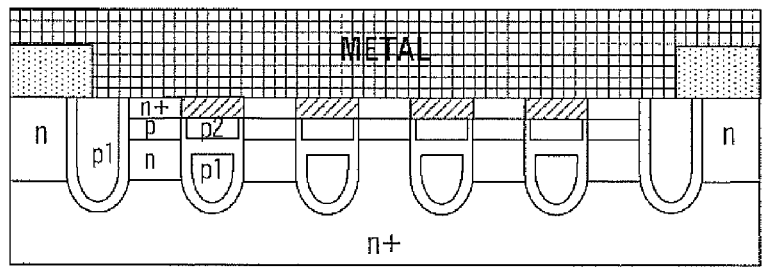
FIG. 4E shows a tenth exemplary sequential process step implementing split gate structures using surface planarization by CMP in accordance with a one embodiment of the present invention.

FIGS. 4A-4E shows further exemplary sequential process steps implementing split gate structures using surface planarization by CMP. Specifically, FIG. 4A shows the vertical structures after the application of poly2 and planarization via CMP. Additionally, FIG. 4C shows the vertical structures after the application of oxide and planarization via CMP. In this manner, embodiments of the present invention implement a chip design with oxide CMP and poly CMP compatible process and layout specifically tailored for CMP to fabricate a split gate power MOSFET.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A split gate field effect transistor device, comprising:
   a split gate structure having a trench, a gate electrode and a source electrode;
   a first poly layer disposed within the trench connected to the source electrode;
   a source contact connecting the first poly layer;
   a second poly layer connected to the gate electrode; and
   a gate contact connecting the second poly layer, wherein a top portion of an oxide within said trench, a surface of an active region, the source contact and the gate contact are coplanar.

2. The device of claim 1, further comprising:
   an active region body; and
   a source contact, wherein the active region body and the source contact are disposed at a same surface plane.

3. The device of claim 2, wherein the same surface plane is established via a CMP compatible process.

4. The device of claim 2, wherein layout method is used to enable a CMP compatible process to connect the first poly layer to the source electrode and the second poly layer to the gate electrode within said trench.

5. A CMP compatible split gate field effect transistor device, comprising:
   a split gate structure having a trench, a gate electrode and a source electrode;
   a source contact coupled to the source electrode;
   a first poly layer disposed within the trench coupled to the source electrode;
   a second poly layer disposed within the trench coupled to the gate electrode;
   a gate contact coupled to the second poly layer, wherein the first poly layer and the second poly layer are independent, and wherein a top portion of an oxide within said trench, a surface of an active region, the source contact and the gate contact are coplanar; and
   a metal layer disposed over the split gate structure.

6. The device of claim 5 further comprising:
   an active region body; and
   a source contact, wherein the active region body and the source contact are disposed at a same surface plane.

7. The device of claim 6, wherein the same surface plane is established via a CMP compatible process.

8. The device of claim 7, wherein layout method is used to enable a CMP compatible process to connect the first poly layer to the source electrode and the second poly layer to the gate electrode within said trench.

9. A planar split gate field effect transistor device, comprising:
   a split gate structure having a trench, a gate electrode and a source electrode;
   a first poly layer disposed within the trench and connected to the source electrode;
   a source contact connecting the first poly layer;
   a second poly layer is disposed within the trench and connected to the gate electrode by a gate contact, wherein the first poly layer and the second poly layer are independent, and wherein the first poly layer and the second poly layer are both disposed within the trench substantially in their entirety, and wherein a top portion of an oxide within said trench a surface of an active region, the source contact and the gate contact are coplanar.

10. The device of claim 9, further comprising:
    an active region body; and
    a source contact, wherein the active region body and the source contact are disposed at a same surface plane.

11. The device of claim 10, wherein the same surface plane is established via a CMP compatible process.

12. The device of claim 11, wherein layout method is used to enable a CMP compatible process to connect the first poly layer to the source electrode and the second poly layer to the gate electrode within said trench.

* * * * *